United States Patent [19]
Takeda

[11] Patent Number: 5,530,920
[45] Date of Patent: Jun. 25, 1996

[54] AUTOMATIC OUTPUT LEVEL CONTROL SYSTEM FOR MULTI-CARRIER RADIO TRANSMISSION APPARATUS

[75] Inventor: Koichiro Takeda, Kawasaki, Japan

[73] Assignee: Fujitsu Limited, Kanagawa, Japan

[21] Appl. No.: 342,313

[22] Filed: Nov. 18, 1994

[30] Foreign Application Priority Data

Apr. 12, 1994 [JP] Japan .................... 6-073370

[51] Int. Cl.⁶ .................................................. H04B 1/02
[52] U.S. Cl. ..................... 455/102; 455/103; 455/115; 455/116; 455/125; 330/129
[58] Field of Search ................... 455/102, 103, 455/108, 115, 116, 126, 127, 129; 330/129; 370/69.1, 121

[56] References Cited

U.S. PATENT DOCUMENTS

| | | | |
|---|---|---|---|
| 4,373,206 | 2/1983 | Suzuki et al. | 455/103 |
| 4,706,243 | 11/1987 | Noguchi | 370/69.1 |
| 5,046,081 | 9/1991 | Umemoto | 379/58 |
| 5,287,555 | 2/1994 | Wilson et al. | 455/115 |
| 5,303,268 | 4/1994 | Tsutsumi et al. | 375/60 |
| 5,381,115 | 1/1995 | Timmons et al. | 330/279 |
| 5,390,361 | 2/1995 | Seppala | 455/126 |
| 5,410,272 | 4/1995 | Haberland et al. | 330/129 |

FOREIGN PATENT DOCUMENTS

| | | | |
|---|---|---|---|
| 1238331 | 9/1989 | Japan . | |
| 371731 | 3/1991 | Japan . | |
| 5335975 | 12/1993 | Japan | 455/127 |

Primary Examiner—Reinhard J. Eisenzopf
Assistant Examiner—Lee Nguyen

[57] ABSTRACT

A multi-carrier radio transmission apparatus provided with an idling detection means for detecting when all of a plurality of modulators are idling and a selective automatic level control means for selectively driving only specific modulators among a plurality of modulators so as to cause them send out their modulated outputs when receiving an idling detection signal from the idling detection means and for enabling an automatic level control unit to perform an automatic level control operation only when receiving an idling detection signal, whereby it is possible to realize a power detector which can exhibit an effect equivalent to that of a diode with a wide dynamic range even when use is made of a diode with a narrow dynamic range.

9 Claims, 18 Drawing Sheets

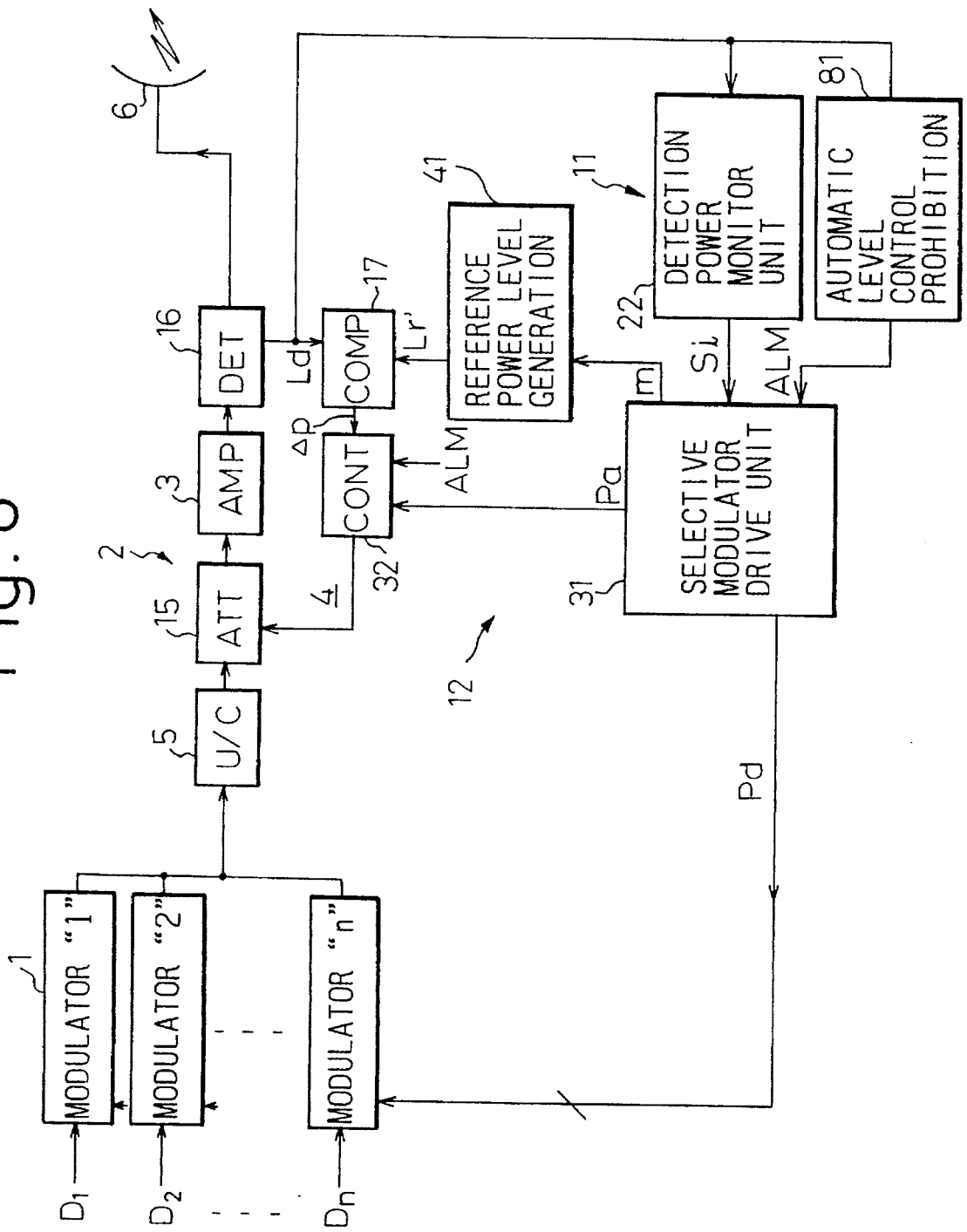

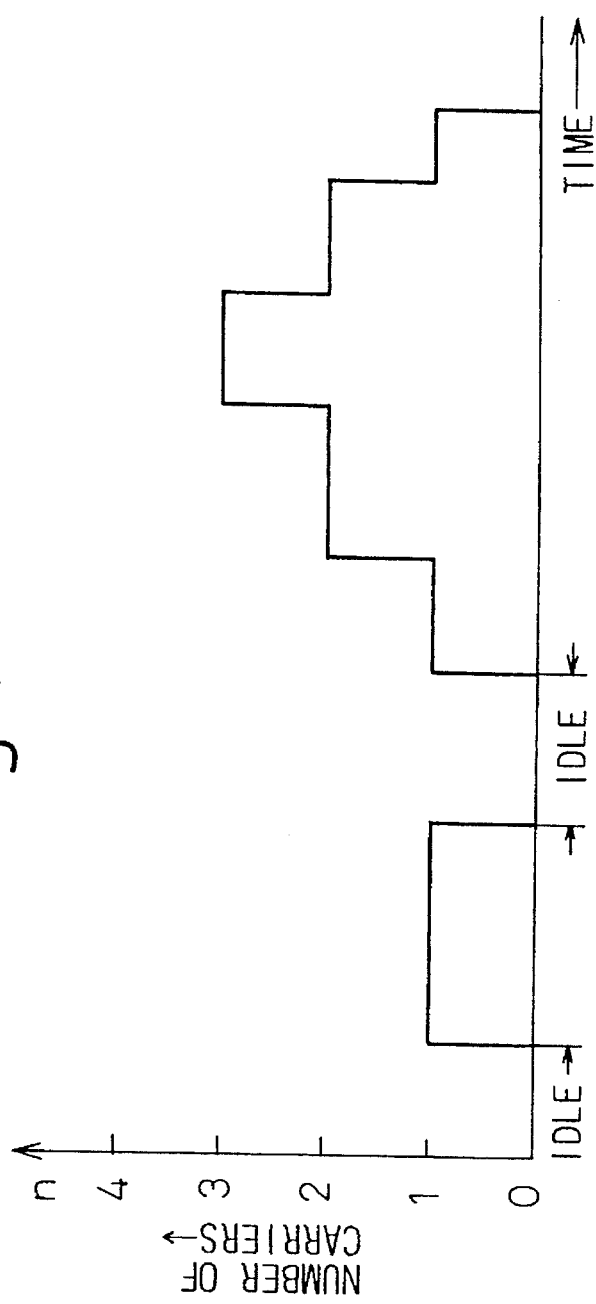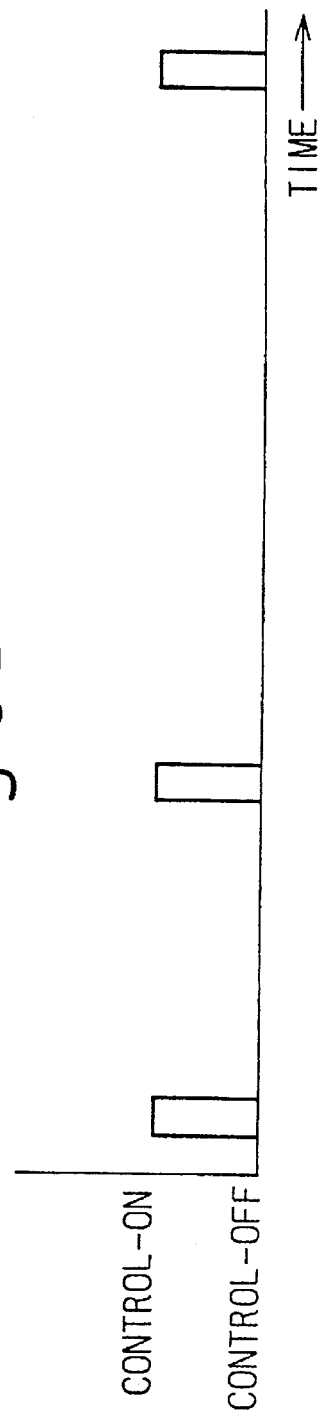

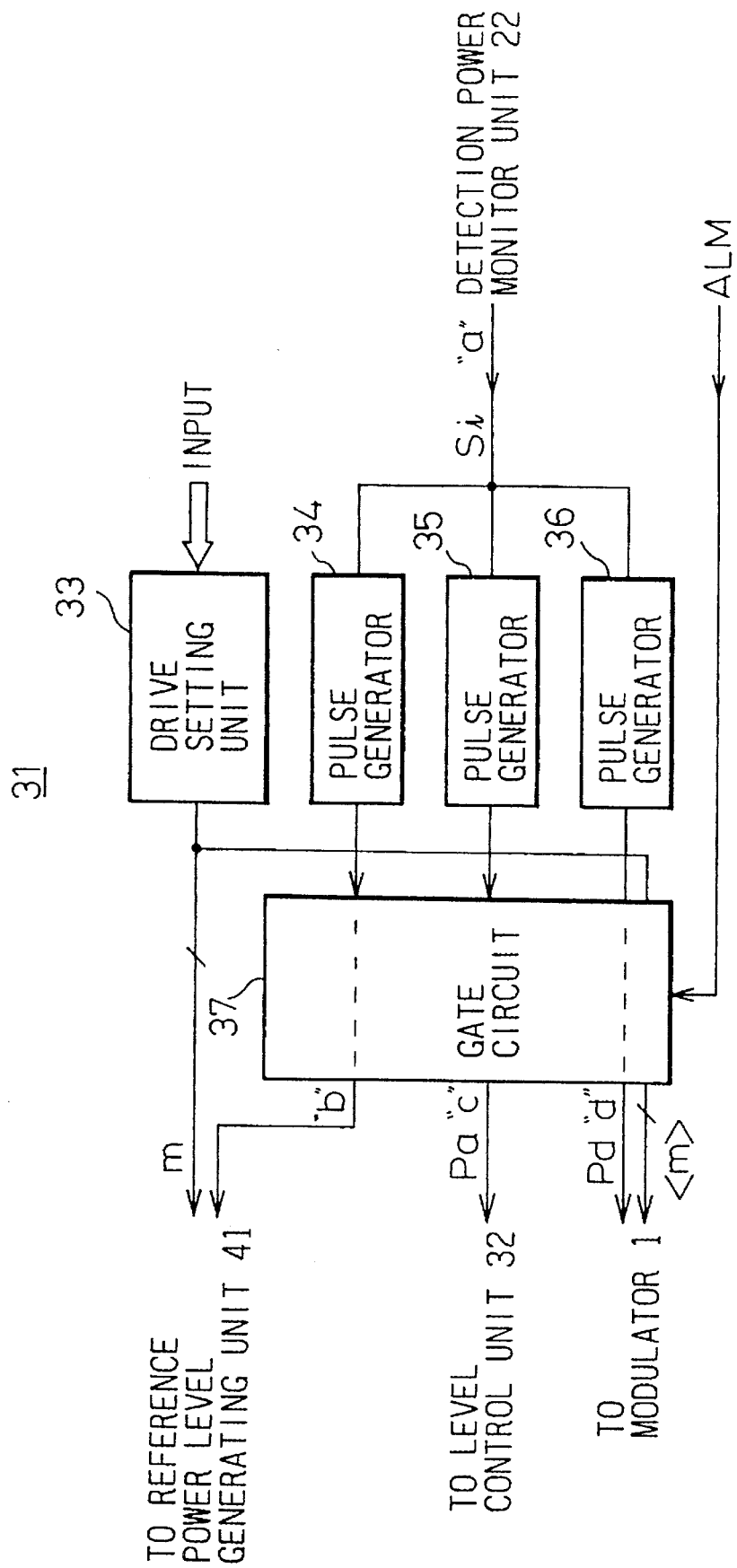

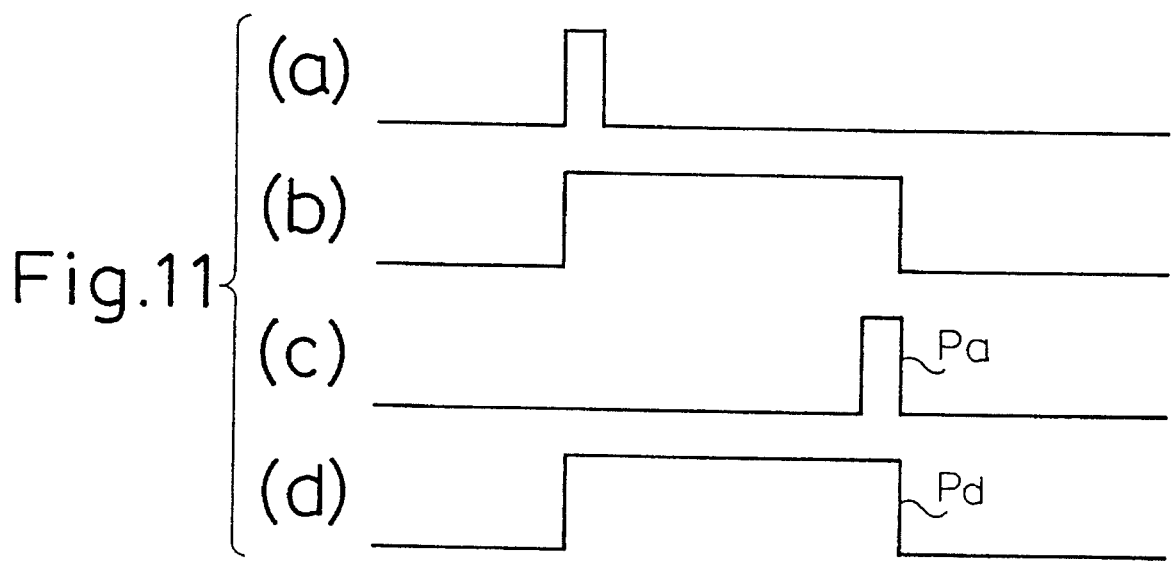

AUTOMATIC OUTPUT LEVEL CONTROL SYSTEM FOR MULTI-CARRIER RADIO TRANSMISSION APPARATUS

BACKGROUND OF THE INVENTION

1. Field of the Invention

The present invention relates to a multi-carrier radio transmission apparatus.

Satellite communication systems make use of so-called multi-carrier radio transmission technology for transmitting a plurality of channels of transmission data on respectively differing carriers. This technique has the advantage of stronger resistance to fading since the widths of the transmission bands are inversely proportional to the number of carriers. The present invention relates to a multi-carrier radio transmission apparatus in a ground station engaging in satellite communication using this technique.

2. Description of the Related Art

As will be explained later in further detail with reference to the drawings, a general multi-carrier radio transmission apparatus is, roughly speaking, comprised of a plurality of modulators and a transmitter. Each of these modulators operates using a different carrier. The carrier is modulated by the respectively corresponding transmission data $D_1, D_2 \ldots D_n$.

The transmitter is provided with an automatic level control (ALC) unit for performing automatic level control to maintain the transmission power at a fixed level. The automatic level control unit is comprised of an attenuator (ATT), a power detector (DET), and a comparator (COMP).

The power detector (DET) is required to be one of a high performance as it must constantly monitor the actual level of the transmission power for carrying out the automatic level control (ALC). As the power detector (DET), use is normally made of a diode. The detecting characteristic of a diode is, however, particularly nonlinear at the higher output range. The linear range is extremely narrow. That is, the dynamic range is narrow.

A diode used for a power detector (DET), however, is required to have a wide dynamic range, that is, to have an output voltage ($V_0$) characteristic which is linear over a wide range of variation of $P_i$.

A diode with such a wide dynamic range, however, is currently extremely expensive and use of one leads to a higher cost of the transmission apparatus.

SUMMARY OF THE INVENTION

Accordingly, in consideration of the above problem, the object of the present invention is to provide a multi-carrier radio transmission apparatus which can give a similar effect as when use is made of an expensive diode with a wide dynamic range even with a power detector using a general inexpensive diode.

To attain the above object, the present invention provides a multi-carrier radio transmission apparatus provided with an idling detection means for detecting when all of a plurality of modulators are idling and a selective automatic level control means for selectively driving only specific modulators among the plurality of modulators so as to cause them to send out their modulated outputs when receiving an idling detection signal from the idling detection means and for enabling an automatic level control unit to perform an automatic level control operation only when receiving an idling detection signal.

BRIEF DESCRIPTION OF THE DRAWINGS

The above object and features of the present invention will be more apparent from the following description of the preferred embodiments with reference to the accompanying drawings, wherein:

FIG. 8 is a view of a seventh embodiment according to the present invention;

FIGS. 9A and 9B are examples of changes in transmission power from a transmitter, wherein FIG. 9A shows the case of use of some modulators and FIG. 9B the case of automatic level control;

FIG. 10 is a view of an example of a selective modulator drive unit;

FIG. 11 is a view of signal waveforms at key parts of FIG. 10;

DESCRIPTION OF THE PREFERRED EMBODIMENTS

Before describing the embodiments of the present invention, the related art and the disadvantages therein will be described with reference to the related figures.

Figure 17:
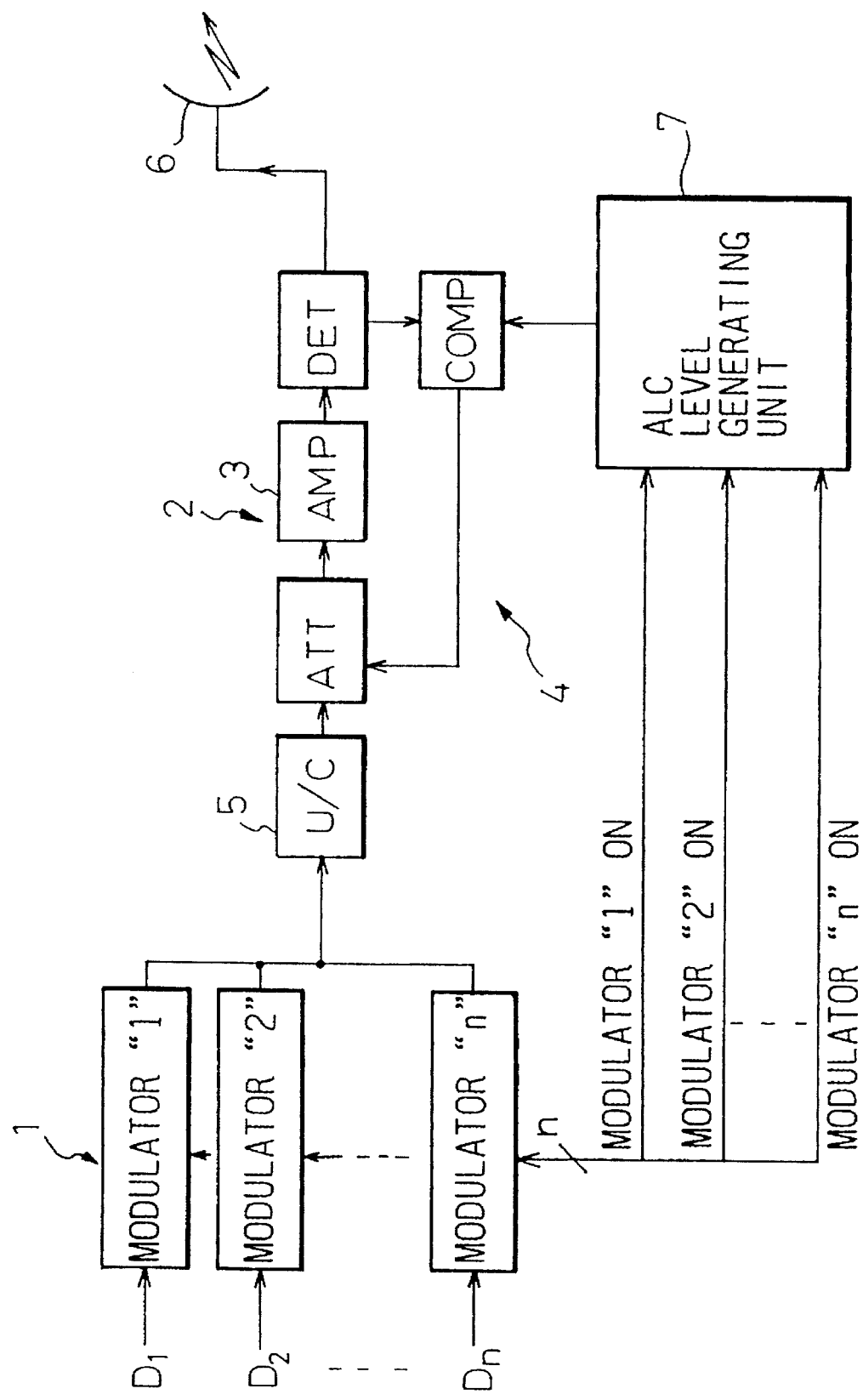
FIG. 17 is a view of an example of a general multi-carrier radio transmission apparatus.

FIG. 17 is a view of an example of a general multi-carrier radio transmission apparatus. In the figure, the multi-carrier radio transmission apparatus is, roughly speaking, comprised of a plurality of modulators 1 and a transmitter 2. Each of these modulators 1 operates using a different carrier. Each carrier is modulated by the respectively corresponding transmission data $D_1, D_2 \ldots D_n$.

The transmitter 2 is provided with an amplifying unit (amplifier AMP) 3 which combines and amplifies the modulated outputs from the modulators 1 and an automatic level control (ALC) unit 4 for performing automatic level control to maintain the transmission power at a fixed level. In the illustrated configuration, the automatic level control unit 4 is comprised of an attenuator (ATT), a power detector (DET), and a comparator (COMP). Further, an up converter (U/C) is provided at a stage in front of the attenuator (ATT).

The automatic level controlled composite modulated output is broadcast from the antenna 6 to a satellite (not shown).

The modulated output broadcast to the radio space contains voice data, picture data, computer data, etc. in each of the channels of transmission data $D_1, D_2 \ldots D_n$, but to transfer the data to the opposing ground station at a low error rate, it is desirable to make the level of the transmission power of the individual channels as high as possible. The satellite reception capacity would be exceeded, however, if a large number of ground stations raised the levels of their transmission power without any limits.

Therefore, a maximum level of transmission power is set in advance for each wave (each carrier) to set an upper limit on the permissible transmission power of each channel sending out the data $D_1, D_2 \ldots D_n$.

If this is done, then for example when only the first modulator "1" is in operation, the transmission power allowed for the transmitter 2 would be for example a maximum 1W. If all of the first to n-th modulators "1" to "n" are in operation, the transmission power allowed for the transmitter 2 would be for example a maximum nW.

To enable the transmitter 2 to faithfully maintain the 1W or nW level of transmission power, provision is made of an automatic level control level generating unit 7. This automatic level control level generating unit 7 monitors the currently operating modulators (modulators which are on) and, for example, if only one modulator "1" is operating (ON), gives a reference power level corresponding to the above 1W (for example, 1 mW) to one of the inputs of the comparator (COMP). At this time, the other input of the comparator (COMP) is provided with a value corresponding to the actual level of the transmission power monitored by the power detector (DET). Here, the comparator (COMP) extracts the difference between the levels and controls the attenuator (ATT) so that difference becomes zero.

If the modulators "1" to "n" are currently operating, the automatic level control level generating unit 7 gives the reference power level corresponding to nW, according to the above example, to one of the inputs of the comparator (COMP). The comparator compares the reference power level with the actual level of transmission power monitored by the power detector (DET) and applies the difference between the two to the attenuator (ATT). The output of the transmitter 2 is thereby fixed to the level of transmission power matching the number of modulators 1 in use at all times.

The power detector (DET) is required to be one of a high performance in order to constantly monitor the actual level of the transmission power for carrying out the automatic level control (ALC).

Figure 18:
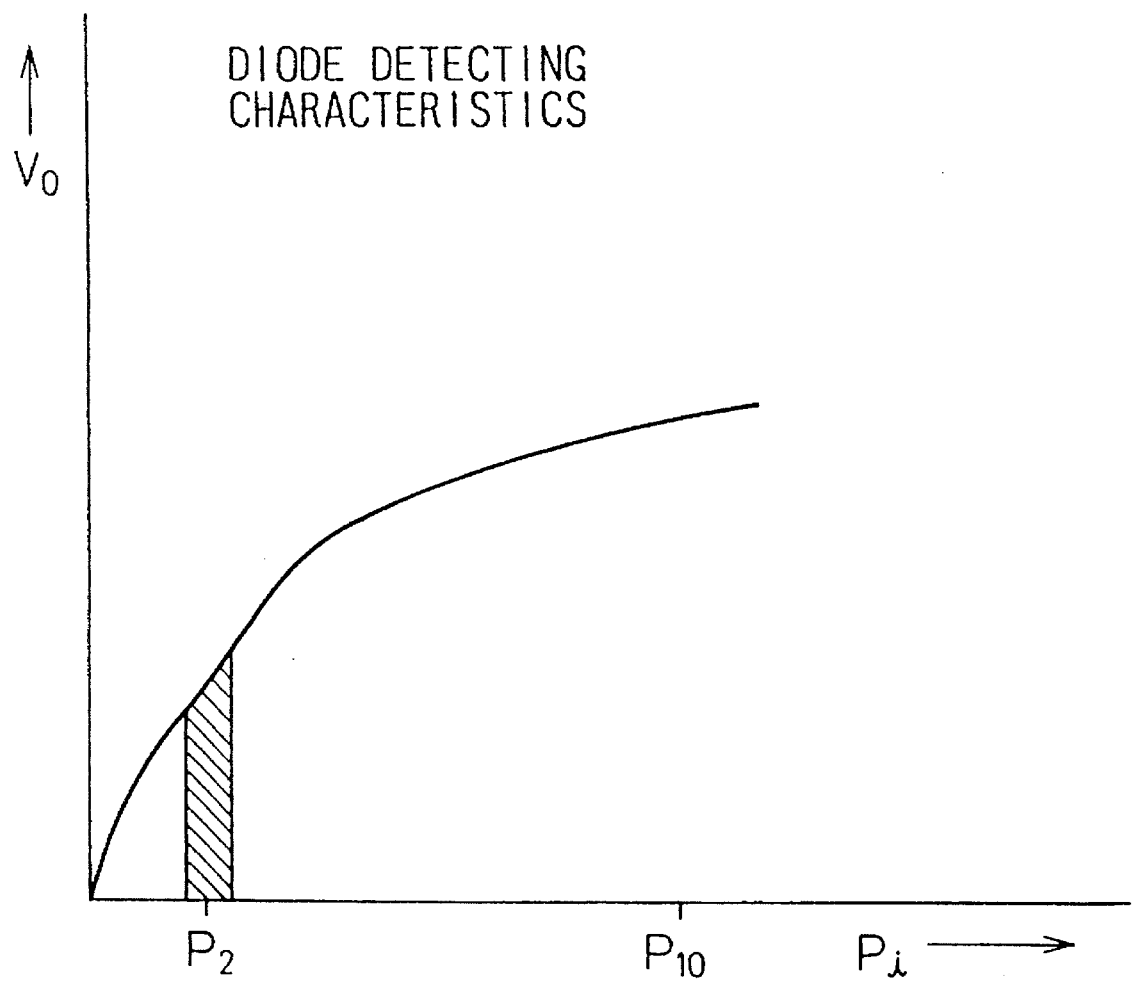
FIG. 18 is a view of the detecting characteristic of a general power detector.

FIG. 18 is a view of the detecting characteristic of a general power detector. As the power detector (DET), use is normally made of a diode. The detecting characteristic of a diode is nonlinear, that is, the detection output voltage $V_0$ is nonlinear with respect to the input power $P_i$ (actual transmission power).

As shown in FIG. 18, the detecting characteristic of the power detector (DET) is particularly nonlinear at the higher output range. The linear range is extremely narrow. That is, the dynamic range is narrow.

On the other hand, as mentioned earlier, the number of the modulators 1 driven varies in the wide range of from 1 to n.

Accordingly, the transmission power $P_i$ forming the horizontal axis of FIG. 18 varies over a wide range as well. This being the case, it is required that the diode used for a power detector (DET) have a wide dynamic range, that is, have a linear output voltage ($V_0$) characteristic over a wide range of fluctuation of $P_i$.

A diode with such a wide dynamic range, however, is currently extremely expensive and use of one leads to a higher cost of the transmission apparatus.

Accordingly, the present invention provides a multi-carrier radio transmission apparatus which can give a similar effect as when use is made of an expensive diode with a wide dynamic range even with a power detector using a general inexpensive diode.

Figure 1:
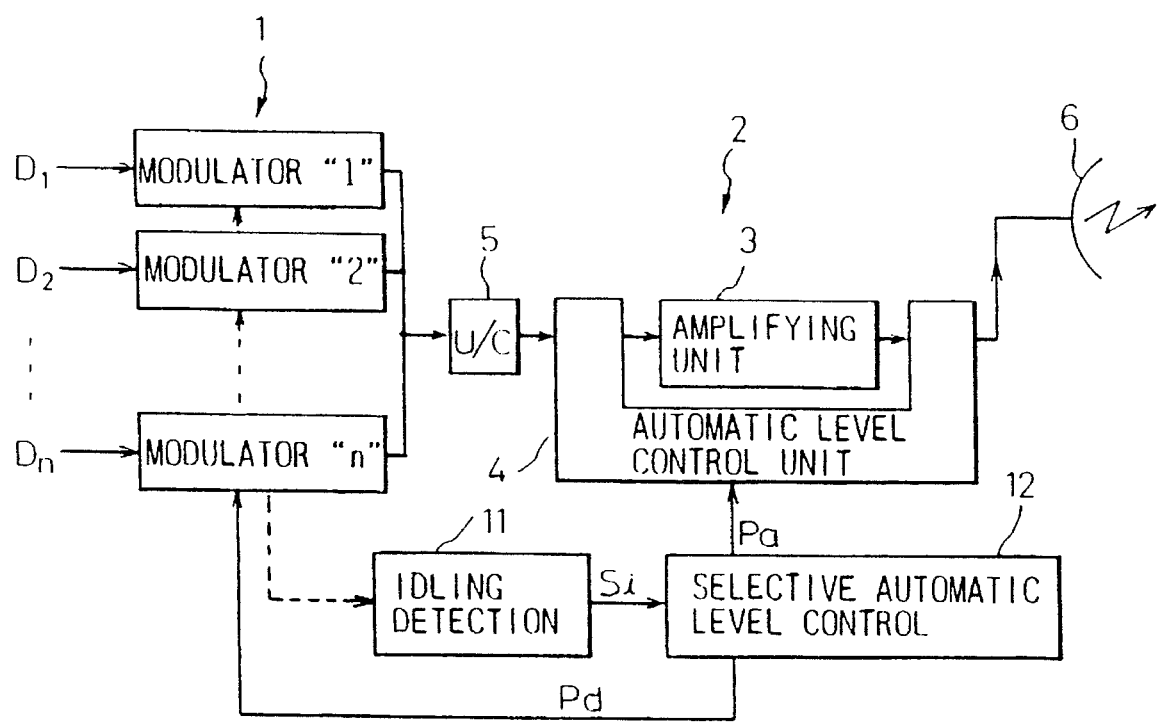
FIG. 1 is a view illustrating the basic configuration of the present invention.

FIG. 1 is a view illustrating the basic configuration of the present invention.

Referring to FIG. 1, the multi-carrier radio transmission apparatus according to the present invention comprises a plurality of modulators 1 each operating at a different carrier, each of which carrier is modulated by respectively corresponding transmission data, a transmitter 2 provided with an amplifying unit 3 for combining and amplifying the modulated outputs from the plurality of modulators 1 and an automatic level control unit 4 forming a closed loop including the amplifying unit 3 and performing automatic level control for maintaining the transmission power at a fixed level, an idling detection means 11 for detecting when all of the plurality of modulators 1 are idle, and a selective automatic level control means 12 for selectively driving as low as one specific modulator 1 among the plurality of modulators 1 to cause them to send out modulated or unmodulated outputs when receiving an idling detection signal $S_i$ from said idling detection means 11 and causing the automatic level control unit 4 to perform an automatic level control operation only when receiving the idling detection signal $S_i$.

As shown in FIG. 1, note that even though use is made of a diode with a narrow dynamic range, selective use is made of only the portion with a good detecting characteristic, that is, the portion of a good linearity (see hatching portion in FIG. 18).

Therefore, the automatic level control unit 4 is made to operate only while exactly m number (n>m, m=1, 2, 3 . . . ) of modulators 1 among the modulators "1" to "n" are operating. Assuming that n=10 and m=2, although the input power $P_i$ shown on the horizontal axis of FIG. 18 reaches a maximum of $P_{10}$, use is made of the diode only around $P_2$. The linearity is the best in that range.

However, it is not efficient to keep on waiting for the time when exactly m number of modulators 1 out of the n number of modulators 1 are operating (are on). Further, when this time does come, it is transitory and therefore too short for sufficient automatic level control.

Therefore, the present invention conversely forcibly creates a period in which just m number of modulators are driven. For this, first, it detects a period when all of the n number of modulators are idling. Therefore, the idling detection means 11 is introduced.

When it is confirmed that a period has arrived when all of the n number of modulators 1 are idling, m number of modulators 1 are specified and are selectively driven (drive pulse $P_d$). Further, the automatic level control unit 4 is activated just while driving them (activation pulse $P_a$). This is done by the selective automatic level control means 12.

Accordingly, even if an inexpensive diode is used as the power detector (DET), use is just made of the linear portion with a good characteristic (hatching portion in FIG. 18) and the remaining nonlinear portion is not used.

This above-mentioned automatic level control was made possible by noting another fact. This was that, looking at the amplifying unit 3, i.e., the main component for determining the magnitude of the transmission power, the gain thereof does not change much in a short time period. Therefore, even if one repeatedly performs temporary automatic level control once every several hours and holds that state until the next automatic level control, the object of fixing the transmission power to a constant level is sufficiently achieved.

In this case, ideally, one should be able to be sure that there is a time when the automatic level control should be performed, that is, a period during which all the n number of modulators 1 are idling, at least several times a day. Statistically, there is a high probability of such a full idling period occurring such as with the hours when offices are shut.

Preferably, the idling detection means 11 can detect when all the modulators 1 are idling by monitoring each of the plurality of modulators 1 to see if they are not being driven.

Also preferably, the automatic level control unit 4 in the transmitter 2 is provided at the output side of the amplifying unit 3 with a power detector (DET) for detecting the transmission power and the idling detection means 11 is able to detect when all the plurality of modulators 1 are idling by monitoring when the detection output of the power detector (DET) becomes substantially zero. control means 12 outputs at least a drive pulse $P_d$ for driving the specified modulators 1 and an activation pulse $P_a$ for activating the automatic level control unit 4 by receiving the idling detection signal $S_i$ from the idling detection means 11.

Further preferably, the automatic level control unit 4 in the transmitter 2 is provided at the output side of the amplifying unit 3 with a power detector (DET) for detecting the transmission power from the transmitter 2 and a comparator (COMP) for detecting the difference between the level of the detection voltage and the prescribed level of the reference power and causing the automatic level control to be performed based on that difference and is further provided with a reference power level generating means for generating a prescribed level of reference power proportional to the number of the modulators 1 specified by the selective automatic level control means 12 and applying the same as the prescribed level of reference power of the comparator (COMP).

Still more preferably, further provision is made of an automatic level control preferential selection means for selectively driving only a specified plurality of modulators out of the plurality of modulators and at that time forcibly not driving the remaining modulators.

Still further preferably, the automatic level control unit 4 in the transmitter 2 is provided, at the output side of the amplifying unit 3, with a power detector (DET) for detecting the transmission power from the transmitter 2 and a comparator (COMP) for detecting the difference between the level of the detection power and the prescribed level of the reference power and causing the automatic level control to be performed based on that difference and is provided with an automatic level control suspension means for collecting and holding data indicative of the difference, calculating the range of variation of the difference held, and causing the operation of the selective automatic level control means 12 to stop when the range of variation of the newly generated difference exceeds an allowable level.

Here, the automatic level control suspension means judges that there is something wrong when the difference is abnormally large and then stops the automatic level control. This is a failsafe measure.

Also preferably, further provision is made of a temperature compensating attenuator which applies a predetermined attenuation to the modulated output added to the automatic level control unit 4 and input to the amplifying unit 3 and a temperature compensating means for calculating in advance and holding optimum amounts of attenuation in accordance with the atmospheric temperatures, reading out the corresponding optimum amount of attenuation each time it detects an atmospheric temperature, and controlling the temperature compensating attenuator accordingly.

Here, the temperature compensating means monitors the temperature, which is a major factor changing the gain of the amplifying unit 3, and reduces the modulated output in accordance with the temperature. This is to lighten the burden of control on the automatic level control unit 4.

Finally, preferably, further provision is made of an automatic level control prohibition means for monitoring the transmission power output from the transmitter 2 and prohibiting the operation of the selective automatic level control means 12 when the level of that transmission power exceeds a predetermined prescribed level.

Here, the automatic level control prohibition means prohibits the operation of the selective automatic level control means 12 when the transmission output from the transmitter 2 becomes abnormally large and thereby prevents in advance any adverse effect on other ground stations.

Figure 2:
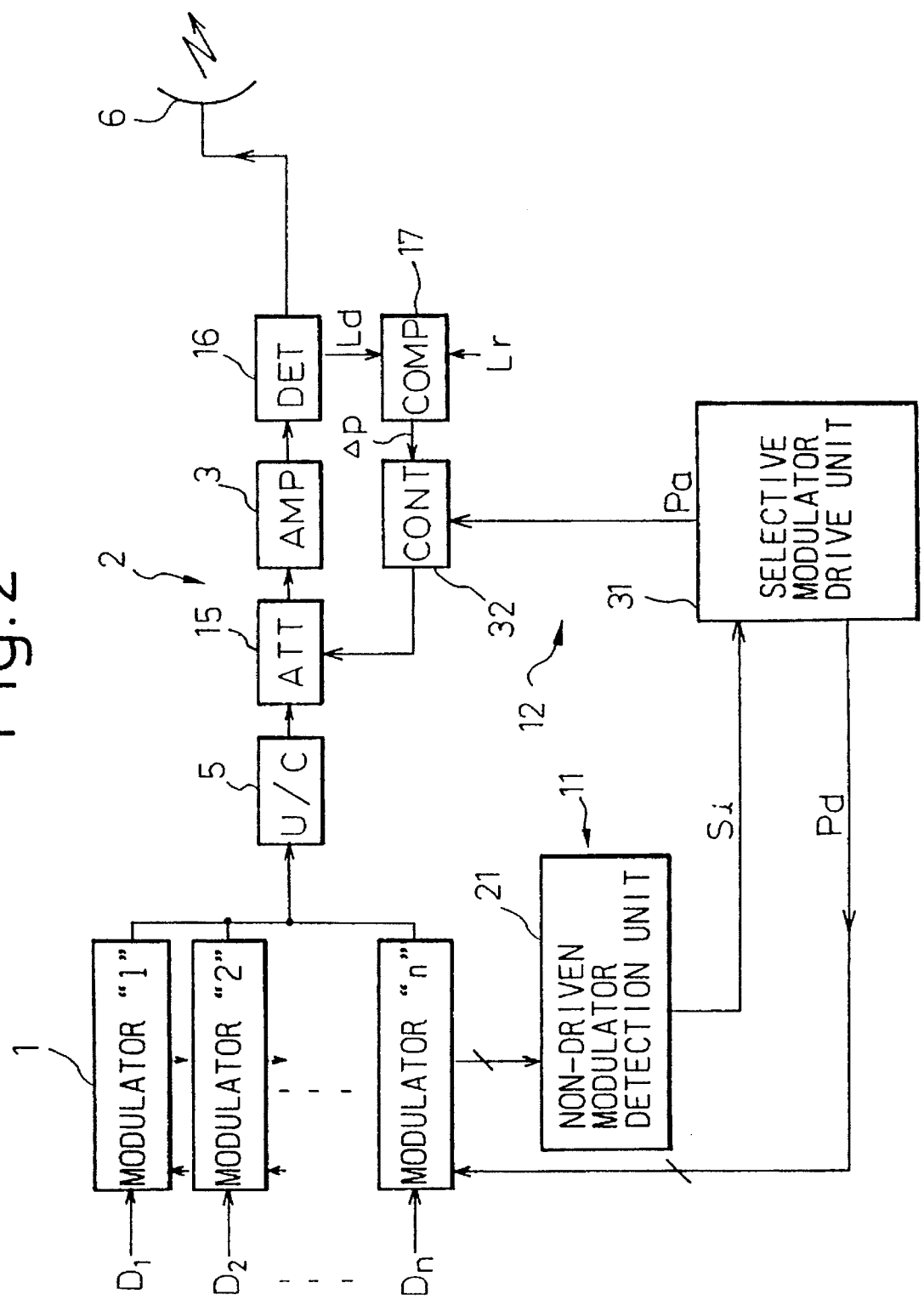
FIG. 2 is a view of a first embodiment according to the present invention.

FIG. 2 is a view of a first embodiment according to the present invention. In the first embodiment, a nondriven modulator detection unit 21 is shown as a specific example of the idling detection means 11. The detection unit 21 detects the modulators 1 which are not driven. A modulator, as everyone knows, generally has a carrier source and a mixer for modulating the carrier from the carrier source by the transmission data (D). A semiconductor switch is inserted between the mixer and the carrier source. By turning the semiconductor switch on, the modulator is driven. By turning it off, it is ceased being driven.

The on/off information of the semiconductor switch, in particular the off information, is used here. The off information is input to the nondriven modulator detection unit 21. The detection unit 21 can be comprised by a logic gate which outputs the idling detection signal $S_i$ when off information is received for all the modulators "1" to "n". Note that the off information is known. In general, it is generated when the disconnection of the transmission data (D) is detected.

On the other hand, the selective automatic level control means 12 is comprised by a selective modulator drive unit 31 and a level control unit (CONT) 32 in this example. When the idling detection signal $S_i$ is applied to the selective modulator drive unit 31, a specific m number (n>m) of modulators among the modulators "1" to "n" are selected and driven by the drive pulse $P_d$.

In this case, it is possible to make the above m (number of modulators to be driven) any number, for example, 2. There is no need to fix m to 2. For example, it is also possible to cyclically repeatedly make m 2 and 4.

The m number of modulators which are selectively driven may be determined in advance. Alternatively, they may be replaced cyclically with other modulators.

If the number (m) of modulators 1 which are selectively driven are set, then the level of the reference power $L_r$ commensurate with that number is determined accordingly.

This $L_r$ is given to one of the inputs of the comparator (COMP) 17 as shown in the figure. The other input is given a value (detection power) $L_d$ corresponding to the actual level of the transmission power by the power detector (DET) 16. The difference $\Delta p$ between $L_r$ and $L_d$ is given to the level control unit (CONT) 32.

If the above-mentioned idling detection signal $S_i$ is received by the selective modulator drive unit 31, the above-mentioned drive pulse $P_d$ is output, then the activation pulse $P_a$ is output. Receiving this drive pulse $P_d$, the level control unit 32 gives the attenuator (ATT) 15 the difference $\Delta p$ from the comparator 17 to cause it to change its amount of attenuation for feedback control so that it settles on a certain power ($L_r$).

Figure 3:
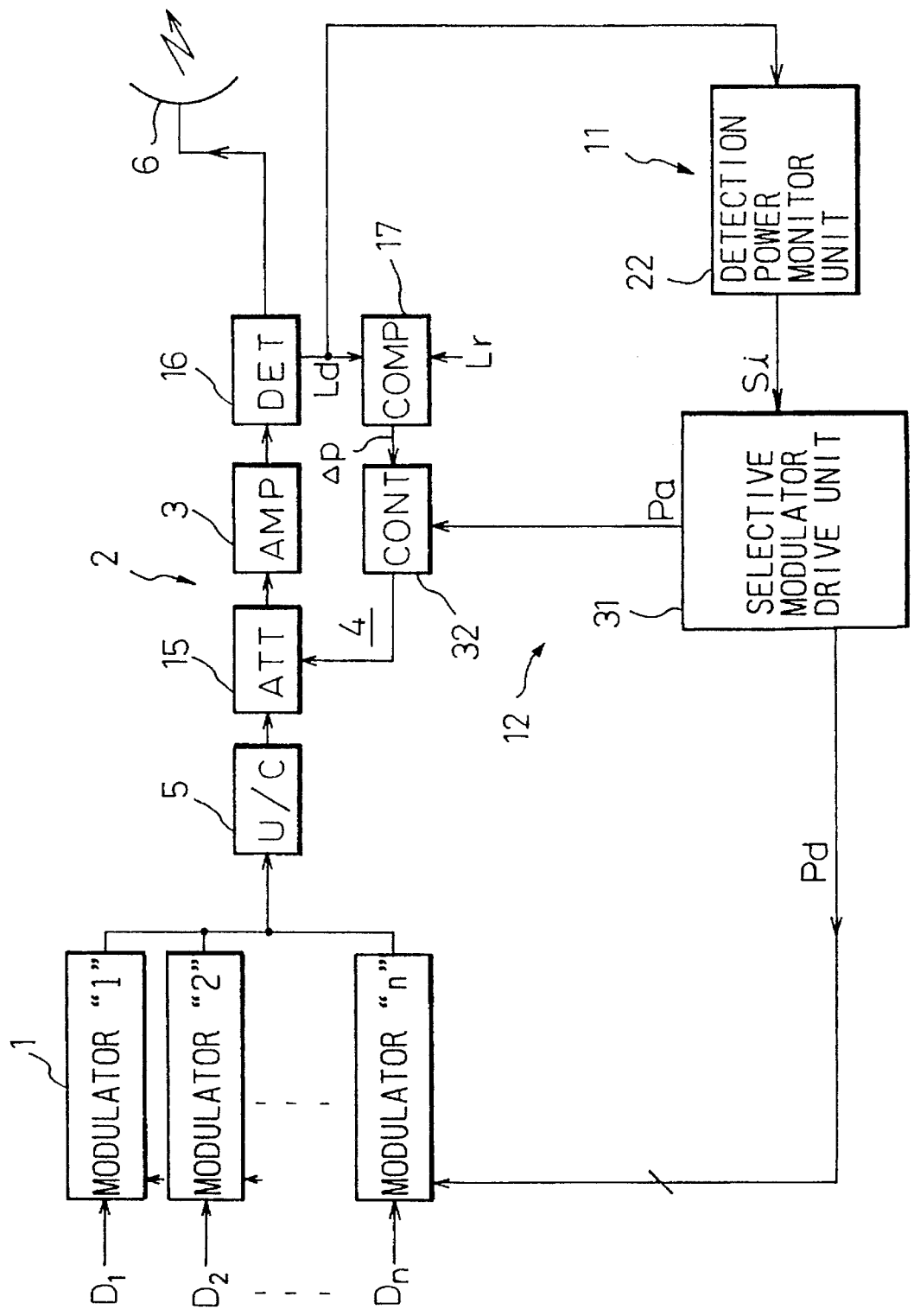
FIG. 3 is a view of a second embodiment according to the present invention.

FIG. 3 is a view of a second embodiment according to the present invention. In this second embodiment, a detection power monitor unit 22 is shown as a specific example of the idling detection means 11. This monitor unit 22 monitors to determine when the detection power of the power detector (DET) 16 becomes substantially zero. The fact that this level of detection power $L_d$ becomes substantially zero means that the transmission power of the transmitter 2 becomes substantially zero. Therefore, at this time, it is regarded that all modulators 1 are not driven. Accordingly, when this $L_d$ becomes substantially zero, the idling detection signal $S_i$ is given to the selective automatic level control means 12. The rest of the operation is the same as in the case of the first embodiment (FIG. 2).

Figure 4:
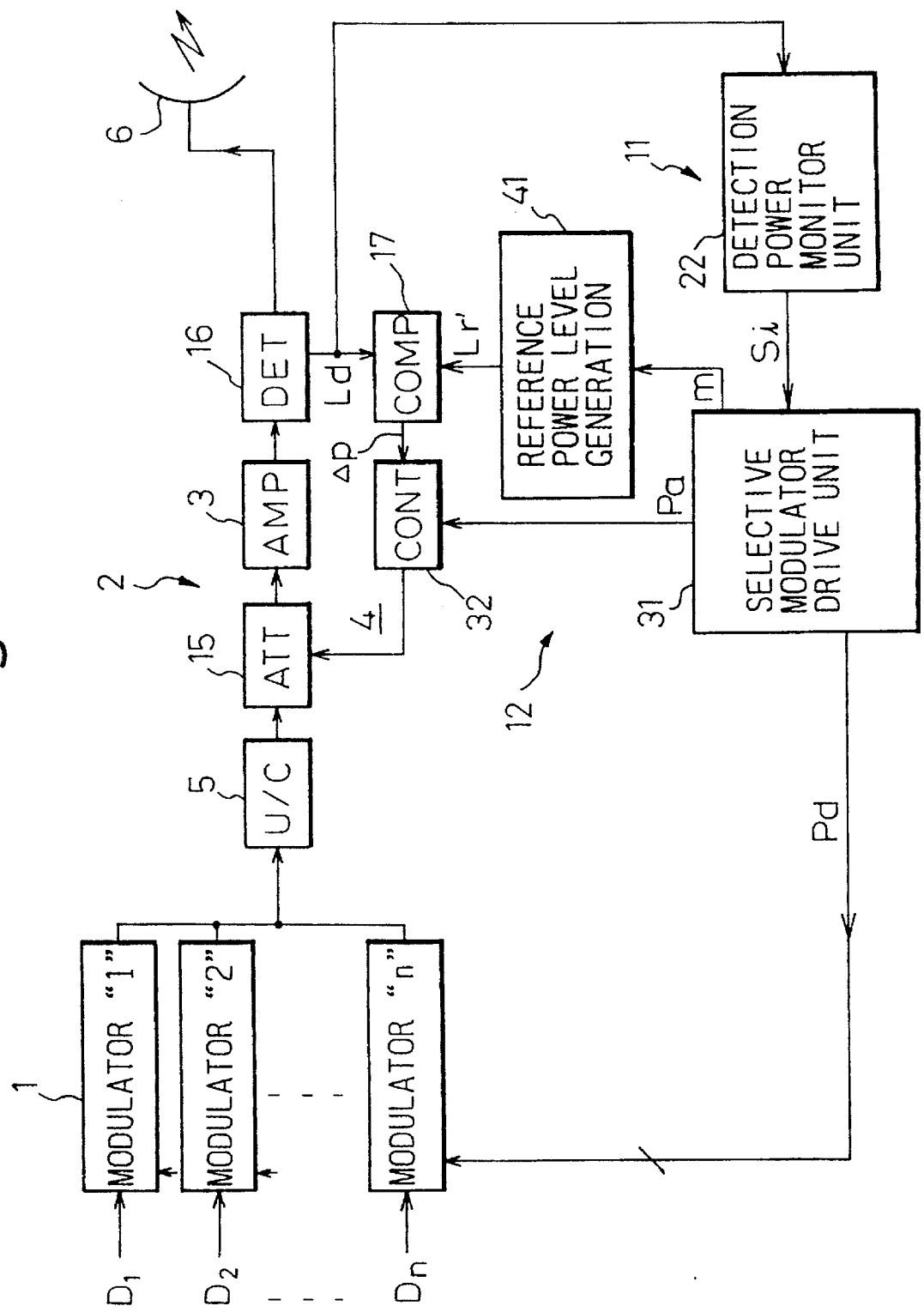
FIG. 4 is a view of a third embodiment according to the present invention.

FIG. 4 is a view of a third embodiment according to the present invention. This third embodiment is designed to deal with the case where the number (m) of modulators to be driven, specified by the selective automatic level control means 12, is made variable. For this purpose, provision is made of a reference power level generation means 41. For example, in the example of FIG. 3, the reference power level $L_r$ was made fixed (for example, m=2), but even an m changed to 3, 4, or 5 can be handled. That is, if the information m for specifying the number of the modulators to be driven is given by the selective automatic level control means 12, a prescribed level of reference power $L_r'$ commensurate with (proportional to) this m is generated and this is given to one of the inputs of the comparator (COMP) 17. Accordingly, the difference $\Delta p$ from the comparator 17 is calculated from the difference between $L_d$ and $L_r'$. The rest of the operation is as explained with reference to FIG. 2.

Figure 5:
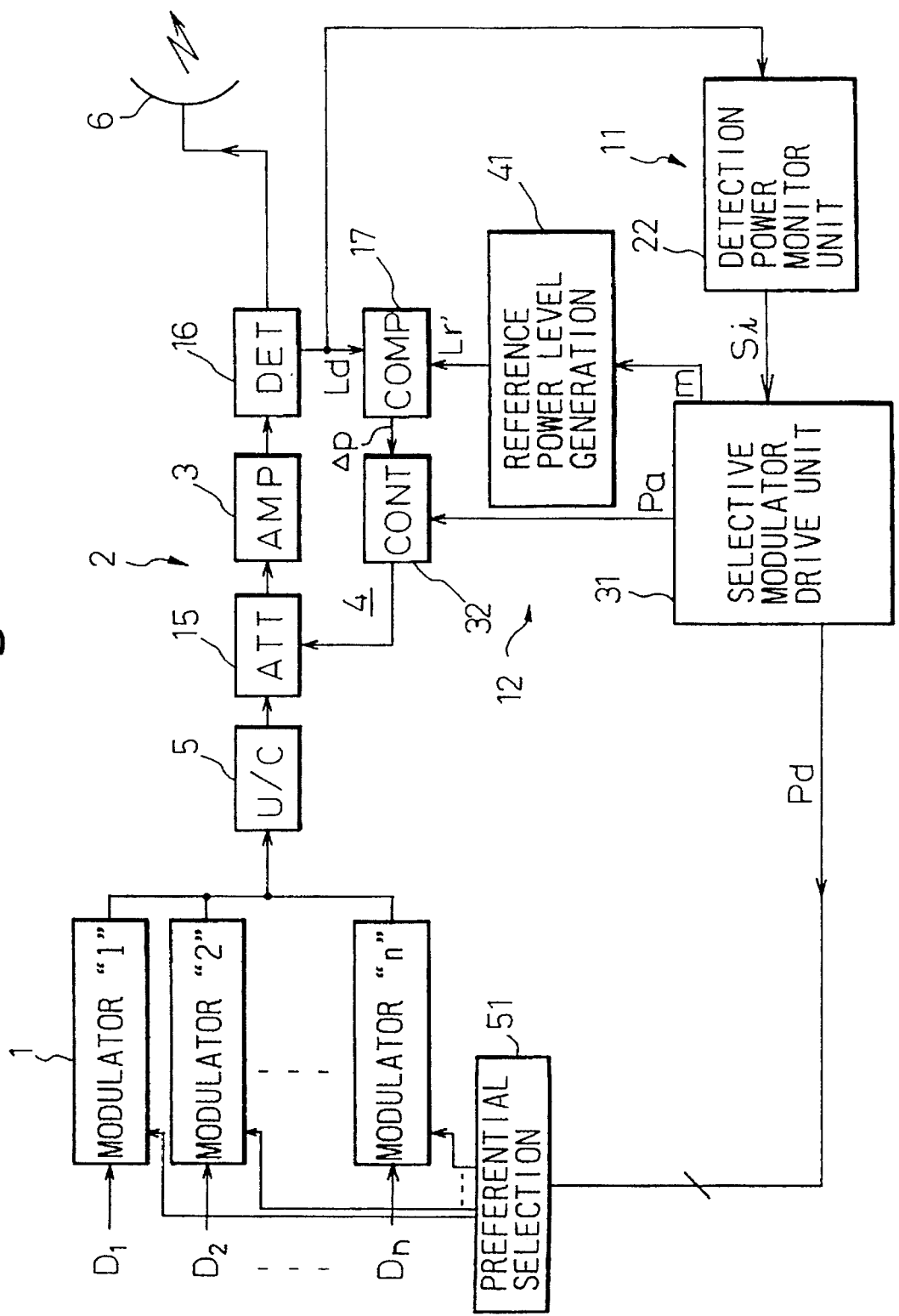
FIG. 5 is a view of a fourth embodiment according to the present invention.

FIG. 5 is a view of a fourth embodiment according to the present invention. In the fourth embodiment, provision is made of an automatic level control preferential selection means 51. Note that the figure shows an example based on the one of FIG. 4 (hereinafter same for other embodiments).

During the period when the m number of modulators 1 specified by the selective automatic level control means 12 are forcibly driven, the remaining (n–m) number of modulators 1 must not be driven. This is because if even one of the remaining modulators is driven, the detection power $L_d$ commensurate with the above-mentioned prescribed reference power level $L_r'$ can no longer be obtained.

Receiving this drive pulse $P_d$, the automatic level control preferential selection means 51 drives only the selected specified modulators 1. At the same time, the nonselected remaining modulators 1 remain undriven even if supplied with the transmission data (D). For example, the above-mentioned on/off control information (explained with reference to FIG. 2) is not kept from being input to the modulators specified to not be driven.

Note that the rest of the operation is as explained with reference to FIG. 2 and FIG. 4.

Figure 6:
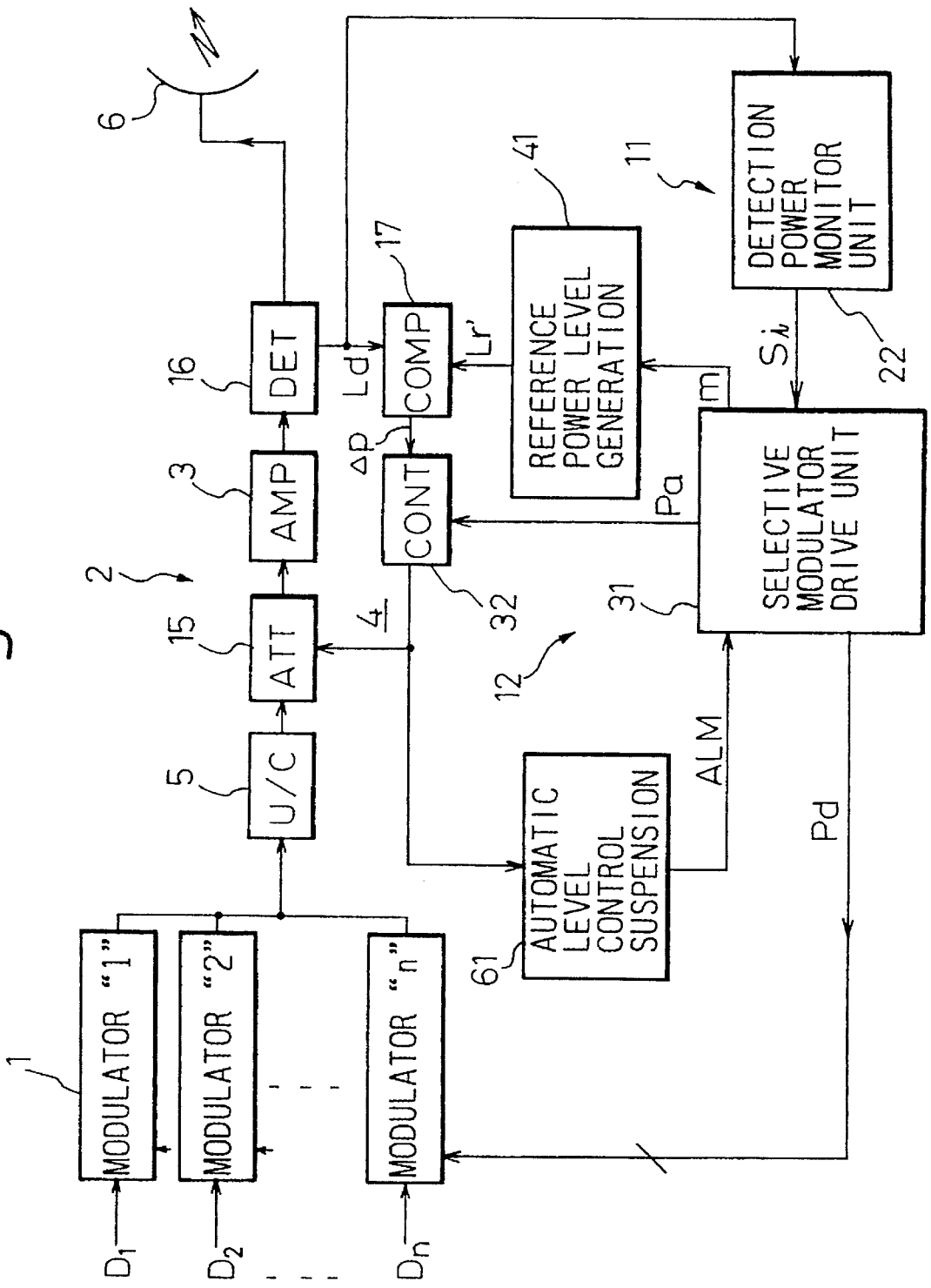
FIG. 6 is a view of a fifth embodiment according to the present invention.

FIG. 6 is a view of a fifth embodiment according to the present invention. In the fifth embodiment, provision is made of an automatic level control suspension means 61.

The differential ($\Delta p$) data given from the comparator (COMP) 17 through the level control unit (CONT) 32 to the attenuator (ATT) 15 changes each time the automatic level control of the present invention is performed. Therefore, the data is collected and held and the state of change of the data over time is recorded. By doing this, it is possible to obtain a grasp of the range of variation of the difference ($\Delta p$).

Usually, the difference ($\Delta p$) appearing from one instant to the next falls in the range of variation. When a difference ($\Delta p$) exceeds the range of variation by more than an allowable level (by a certain margin), it is presumed that a fault has occurred in one of the transmission apparatuses. When such a situation occurs, the suspension means 61 issues an alarm ALM and stops the operation of the selective automatic level control means 12. When the difference $\Delta p$ becomes too large and the amount of the attenuation at the attenuator (ATT) 15 becomes extremely small, the transmission power becomes abnormally large and trouble is caused at other ground stations. Therefore, the means 61 is provided as a failsafe mechanism.

Figure 7:
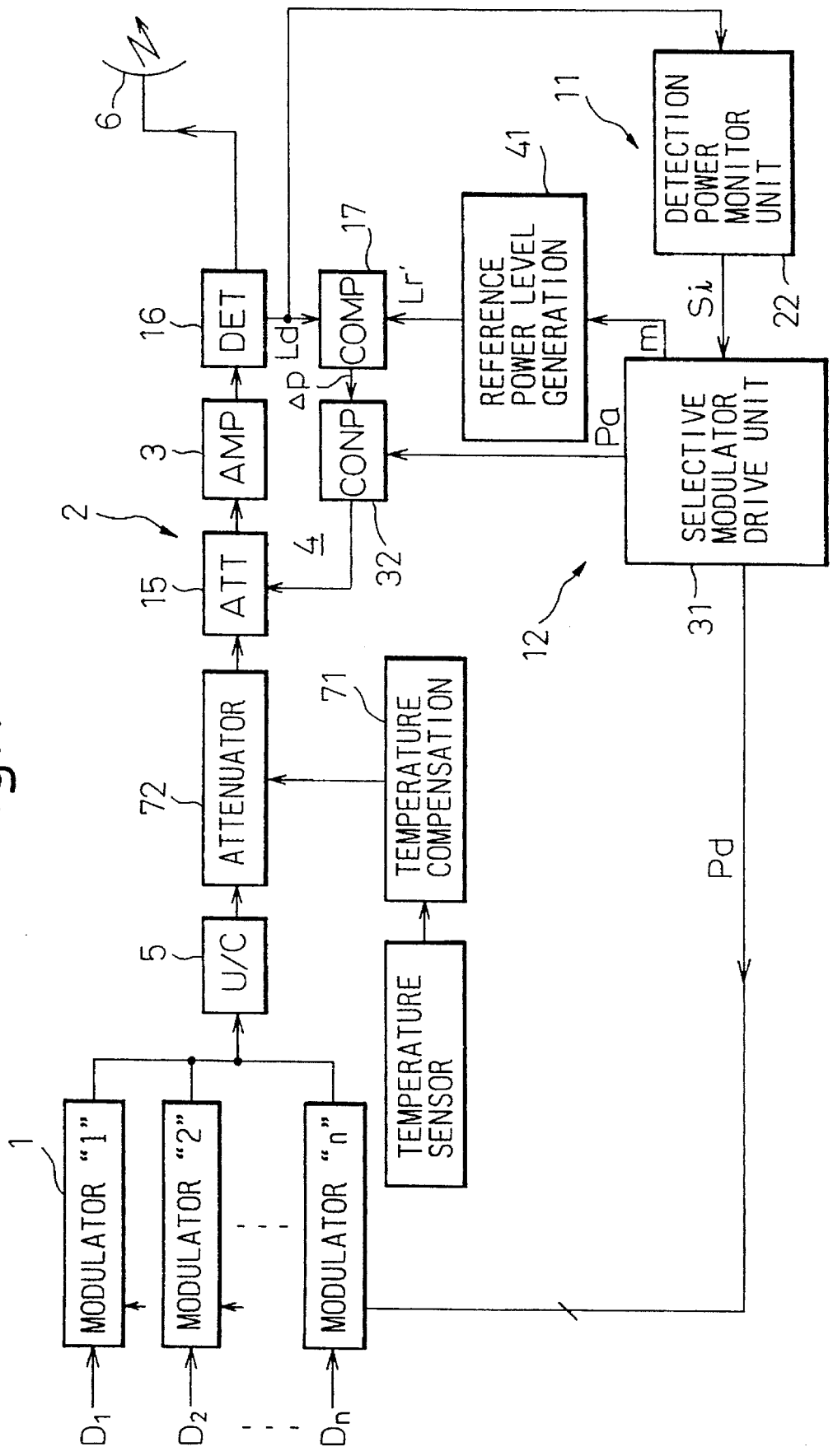
FIG. 7 is a view of a sixth embodiment according to the present invention.

FIG. 7 is a view of a sixth embodiment according to the present invention. In the sixth embodiment, provision is made of a temperature compensation means 71. Also, a temperature compensating attenuator 72 is inserted at the illustrated position.

In the present invention, the power detector (DET) 16 is made to operate only in the region given the hatching in the detecting characteristic shown in FIG. 18. Accordingly, it is desirable that the output of the amplifying unit 3 not fluctuate that much. Since the gain of the amplifying unit 3 changes considerably in accordance with changes in temperature, if there is a large change in temperature, the output of the amplifying unit 3 ends up changing considerably.

Therefore, the point of the present embodiment is to detect the changes in temperature by another route and perform adjustment in advance before the modulated output is supplied to the transmitter 2.

Therefore, first, the atmospheric temperature is measured by the temperature sensor and given to the temperature compensation means 71. The means 71 designates the optimal amount of attenuation to be given to the modulated output according to the measured atmospheric temperature. Note that this optimal amount of attenuation is calculated in advance for different temperatures and held in the means 71.

When the optimum amount of attenuation is specified by the means 71, the temperature compensating attenuator 72 causes the output of the modulators to attenuate in accordance with the same.

Therefore, it is possible to lighten the load on the automatic level control unit 4 and facilitate the control in the range of hatching of FIG. 18.

FIG. 8 is a view of a seventh embodiment according to the present invention. In the seventh embodiment, provision is made of the automatic level control prohibition means 81. This means 81 monitors the detection power from the power detector (DET) 6 and when judging that the transmission power from the transmitter 2 is greater than the predetermined prescribed level, issues the alarm ALM and prohibits the operation of the selective automatic level control means 12.

When the transmission power becomes excessively large due to some abnormality in the transmission apparatus, it has a detrimental effect on the other ground stations, so the automatic level control is prohibited. In this case, it is desirable that the differential (Δp) data from the level control unit (CONT) 32 be fixed to a predetermined value by the alarm ALM.

FIGS. 9A and 9B are examples of changes in transmission power from a transmitter, wherein FIG. 9A shows the case of use of some modulators and FIG. 9B the case of automatic level control. The vertical axis in FIG. 9A shows the number of carriers, that is, the number of modulators in operation and thereby the changes in the transmission power. The horizontal axis shows time. FIG. 9B shows the transmission power in the state entering automatic level control in a pulse form.

When an idling period ("IDLE" in figure) occurs during normal transmission, the m number of specified modulators are driven. Accordingly, the transmission power in FIG. 9B is kept constant. Note that FIG. 9B shows the case where m=1.

FIG. 10 is a view of an example of a selective modulator drive unit 31; while FIG. 11 is a view of signal waveforms at key parts of FIG. 10.

In FIG. 10, the selective modulator drive unit 31 is comprised of a drive setting unit 33 for holding information <m> showing the number m of modulators to be driven in the idling period and which modulators they are, the pulse generators 34, 35, and 36 for generating pulses of different timings upon receipt of the idling detection signals $S_i$ from the detection power monitor unit 22, and the gate circuit 37 (normally through).

The waveforms of the pulses appearing at the portions "a", "b", "c", and "d" in FIG. 10 are shown by (a), (b), (c), and (d) in FIG. 11. When the pulse "a" arrives, the pulses "c" and "d" are generated and output.

The pulses "c" and "d" activate the level control unit 32 and drive the modulators 1 specified by <m>. After the operation of the modulators 1 and level generators 41 stabilize, the level control unit 32 is activated.

The gate circuit 37 is opened (turned off) when the alarm ALM shown in FIG. 6 and FIG. 8 is received.

Figure 12:
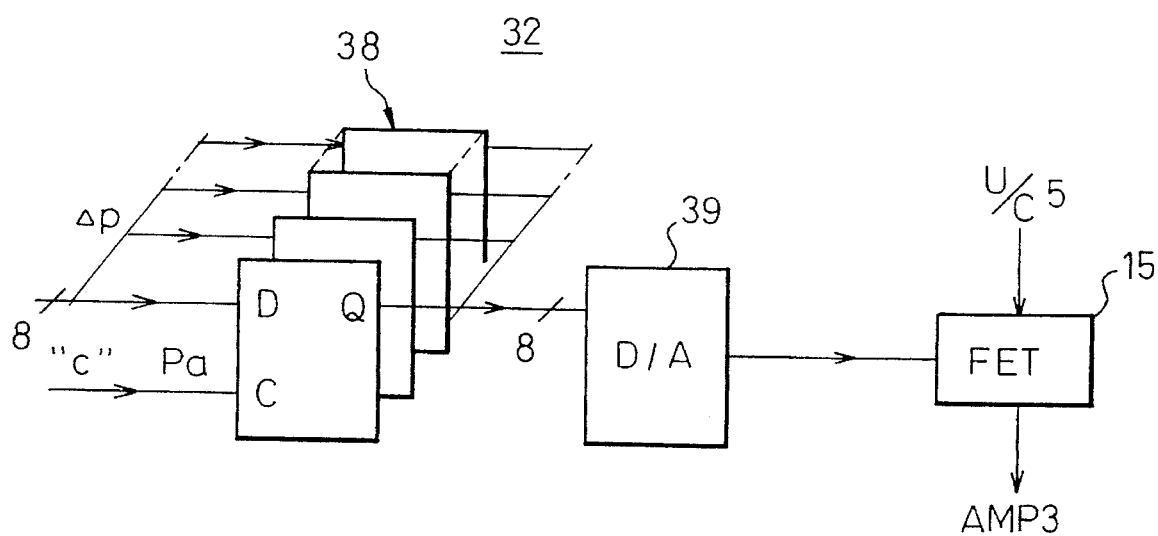
FIG. 12 is a view of an example of a level control unit (CONT)

FIG. 12 is a view of an example of a level control unit (CONT). The differential data (Δp) given from the comparator (COMP) 17 is for example 8-bit data and is latched at the D-flipflops 38 corresponding to the bits. The timing of the latching is the time when an activation pulse $P_a$ (row (c) in FIG. 11) is produced from the selective modulator drive unit 31.

The latched differential data (Δp) is converted into an analog signal at the digital/analog converter (D/A) 39 and given to the attenuator (ATT) 15.

The attenuator 15 is comprised of a PIN diode or a high power amplifying FET. In the figure, an FET is shown. The analog signal is given as a drain bias of the FET to change the gain of the FET and thereby control the amount of attenuation.

Figure 13:
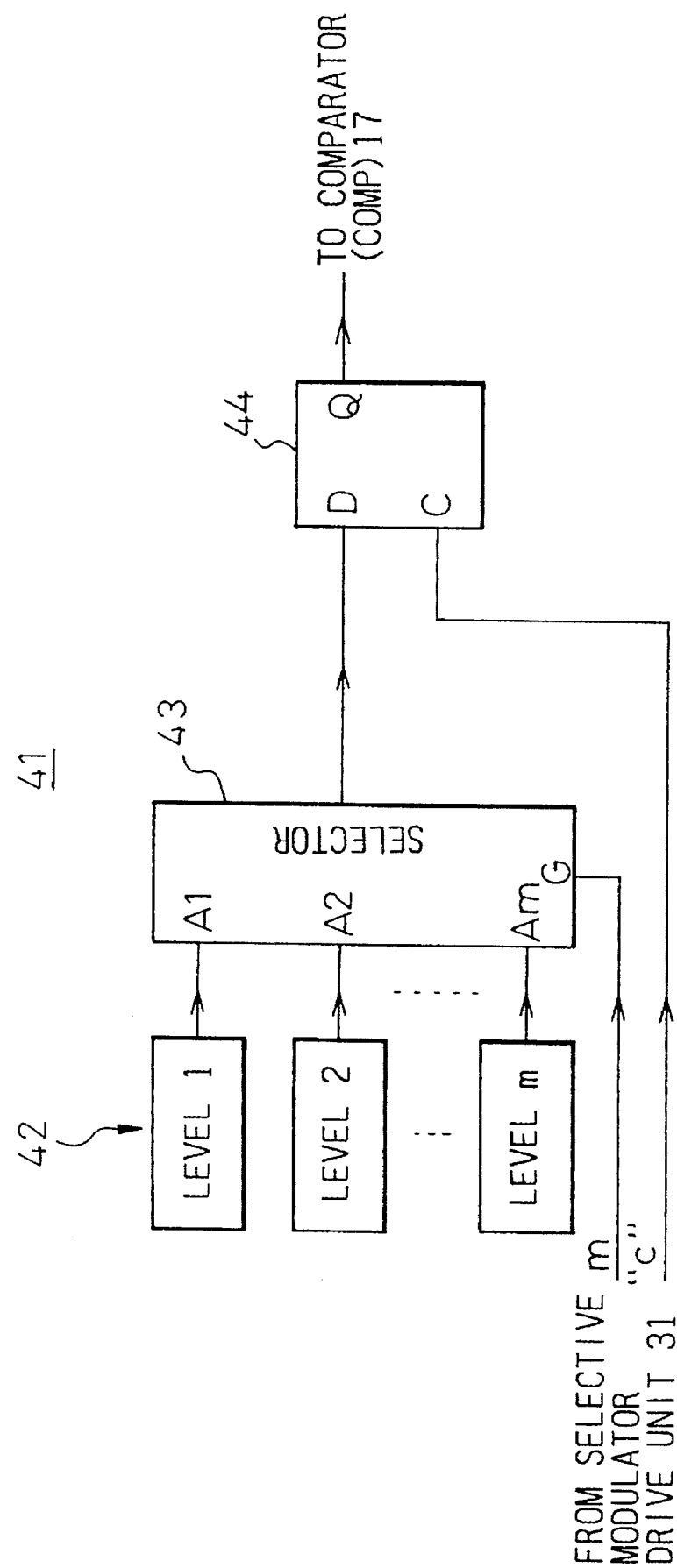
FIG. 13 is a view of an example of a reference power level generating means.

FIG. 13 is a view of an example of a reference power level generating means 41. In the figure, 42 shows the level generators. Each outputs the level of one carrier wave's worth, 2 waves' worth, ... m waves' worth of the reference power in a digital form. Each is comprised for example by a ROM. Reference numeral 43 is a selector, which selects the generator 42 of the "level 2" when for example m=2 in accordance with the information of the number (m) of the modulators to be driven. This selection output is latched at the D-flipflop 44 at the timing of the pulse "c" (row (c) of FIG. 11) and applied to one input of the comparator 17.

Figure 14:
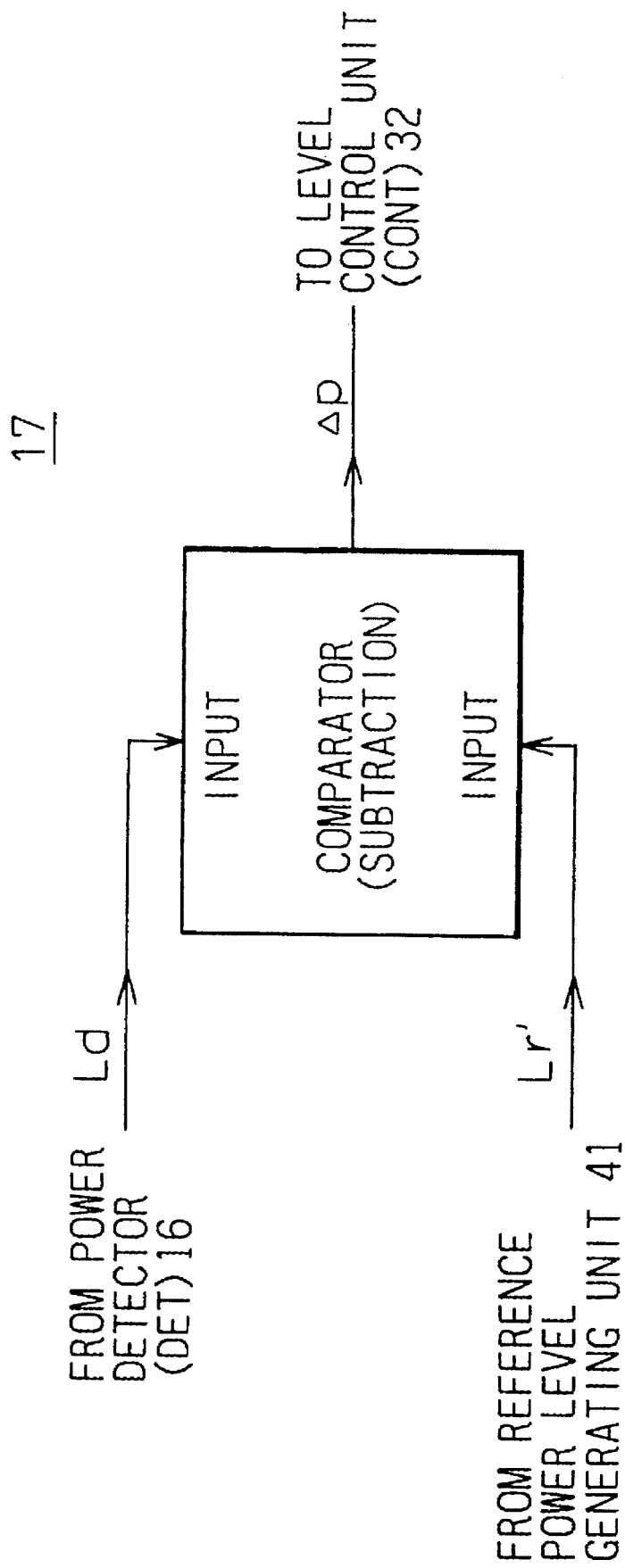
FIG. 14 is a view of an example of a comparator.

FIG. 14 is a view of an example of a comparator 17. As shown in the figure, the comparator 17 receives as input the above-mentioned $L_d$ and $L_r'$ and outputs the difference Δp.

Figure 15:
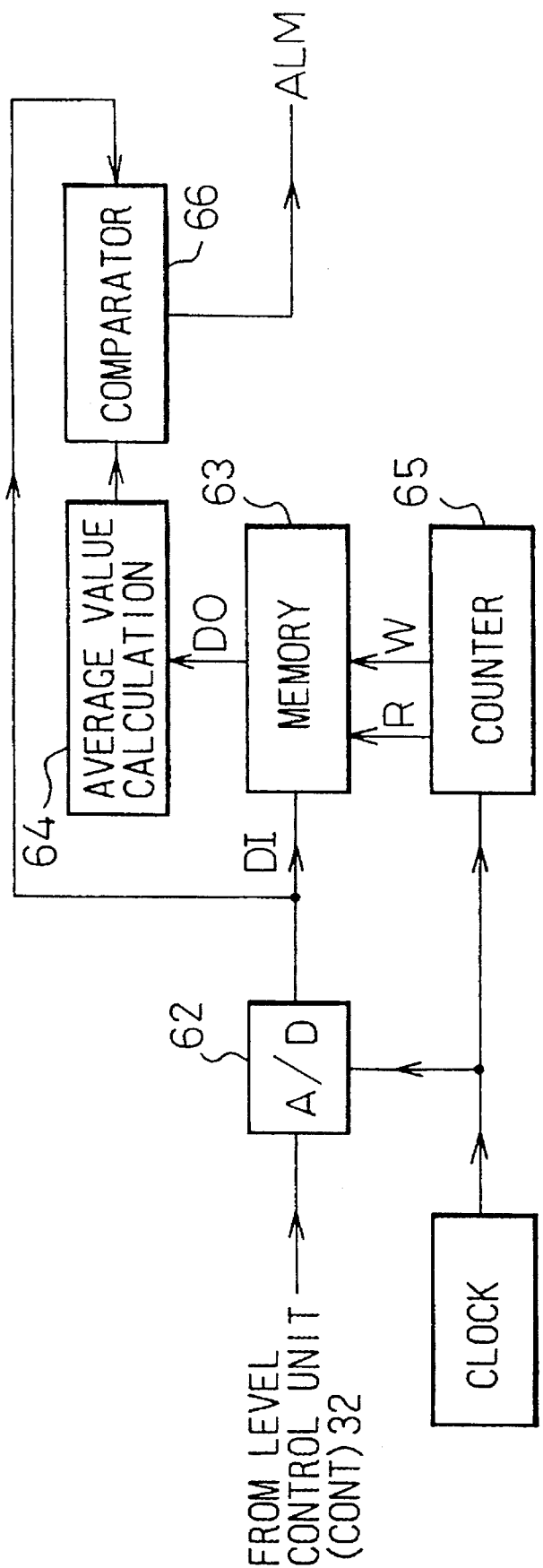
FIG. 15 is a view of an example of an automatic level control suspension means.

FIG. 15 is a view of an example of an automatic level control suspension means. In the figure, the signal of the difference (Δp) from the level control unit 32 is once again converted to a digital signal (DI) at the analog/digital converter (A/D) 62 and written in the memory 63 with the write address from the counter 65. Further, it is read out to the average value calculating unit 64 by the read address R. The read and write operations are performed alternately at for example 5 minute intervals. The average value is found for the data (Δp) of the past 24 hours to calculate the range of variation. This is sent to one input of the comparator 66.

The latest differential data (Δp) is constantly input to the other input of the comparator 66 and compared with the average value at the first input. If it is found by the comparison that the difference far exceeds the range of variation, the alarm ALM is issued.

Figure 16:
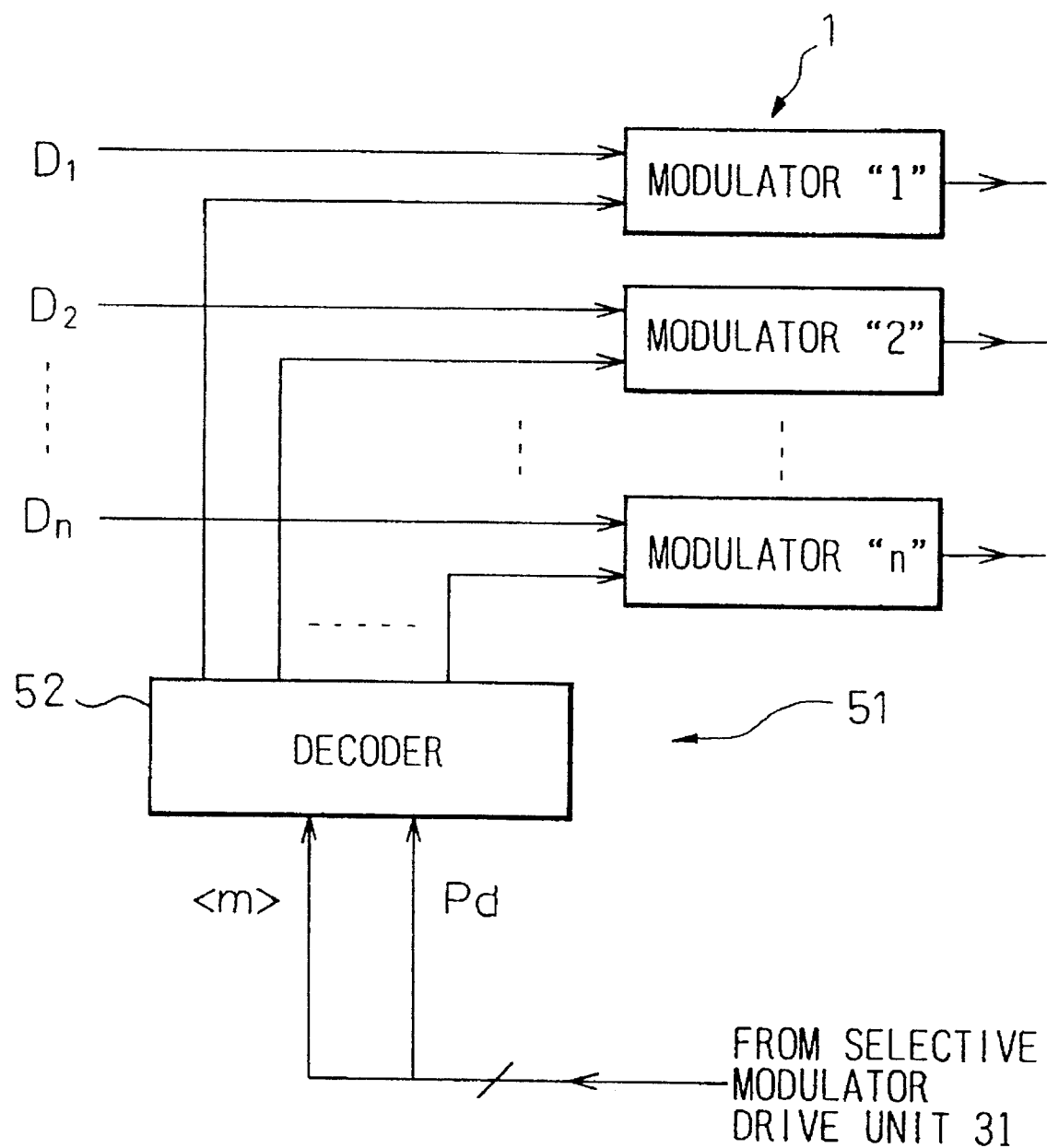
FIG. 16 is a view of an example of an automatic level control preferential selection means.

FIG. 16 is a view of an example of an automatic level control preferential selection means 51. As illustrated in the figure, the means 51 may be comprised by a decoder 52. The decoder 52 receives information <m> specifying the modulators to be driven, decodes the same, and drives the corresponding one or more modulators 1. More specifically, it obtains the logical OR with the on/off information applied to the semiconductor switch and applies the result to the control gate of the semiconductor switch.

As explained above, according to the present invention, it is possible to construct a power detector using an inexpensive diode with a poor linearity (narrow dynamic range) and thereby to reduce the cost of a multi-carrier radio transmission apparatus.

I claim:

1. A multi-carrier radio transmission apparatus comprising:

a plurality of modulators each operating using a different carrier, each carrier modulated by respectively corresponding transmission data, a transmitter provided with an amplifying unit for combining and amplifying the modulated outputs from the plurality of modulators and an automatic level control unit forming a closed loop including the amplifying unit and performing automatic level control for maintaining the transmission power at a fixed level, an idling detection means for detecting when all of the plurality of modulators are not driven or idling, and a selective automatic level control means connected to said plurality of modulators and to said automatic level control unit for selectively driving as low as one specific modulator among the plurality of modulators to cause the driven modulators to send out modulated or unmodulated outputs when receiving an idling detection signal from said idling detection means and causing said automatic level control unit to perform an automatic level control operation only when receiving said idling detection signal.

2. A multi-carrier radio transmission apparatus as set forth in claim 1, wherein the idling detection means detects when all the modulators are idling by monitoring each of the plurality of modulators to see if they are not being driven.

3. A multi-carrier radio transmission apparatus as set forth in claim 1, wherein the automatic level control unit in the transmitter is provided at the output side of the amplifying unit with a power detector detecting the transmission power and the idling detection means detects when all the plurality of modulators are idling by monitoring when the detection output of the power detector becomes substantially zero.

4. A multi-carrier radio transmission apparatus as set forth in claim 1, wherein the selective automatic level control means outputs at least a drive pulse for driving the specified modulators and an activation pulse for activating the automatic level control unit by receiving the idling detection signal from the idling detection means.

5. A multi-carrier radio transmission apparatus as set forth in claim 1, where the automatic level control unit in the transmitter is provided at the output side of the amplifying unit with a power detector for detecting the level of transmission power from the transmitter and for outputting a corresponding detection voltage and a comparator for detecting a difference between the level of the detection voltage and a predetermined level of reference power, and causing the automatic level control to be performed based on that difference, and is provided with a reference power level generating means for generating said predetermined level of reference power proportional to the number of the modulators specified by the selective automatic level control means and applying the same as the predetermined level of reference power of the comparator.

6. A multi-carrier radio transmission apparatus as set forth in claim 1, wherein further provision is made of an automatic level control preferential selection means for selectively driving only a specified plurality of modulators out of the plurality of modulators and at that time forcibly not driving the remaining modulators.

7. A multi-carrier radio transmission apparatus as set forth in claim 1, wherein the automatic level control unit in the transmitter is provided, at the output side of the amplifying unit, with a power detector for detecting the level of transmission power from the transmitter and a comparator for detecting the difference between the level of the transmission power and a predetermined level of reference power, and causing the automatic level control to be performed based on that difference and is provided with an automatic level control suspension means for collecting and holding data indicative of the difference, calculating a range of variation of the difference held, and causing operation of the selective automatic level control means to stop when the range of variation of a newly generated difference exceeds an allowable level.

8. A multi-carrier radio transmission apparatus as set forth in claim 1, further comprising a temperature compensating attenuator connected to said automatic level control unit, which attenuator applies a predetermined attenuation to the modulated output of said modulators that is input to the amplifying unit, and a temperature compensating means connected to said attenuator for calculating in advance and holding optimum amounts of attenuation in accordance with the atmospheric temperatures, reading out the corresponding optimum amount of attenuation each time it detects the atmospheric temperature, and controlling the temperature compensating attenuator accordingly.

9. A multi-carrier radio transmission apparatus as set forth in claim 1, further comprising an automatic level control prohibition means for monitoring the transmission power output from the transmitter and prohibiting operation of the selective automatic level control means when a level of that transmission power exceeds a predetermined prescribed level.

* * * * *